(12) United States Patent
Mori (10) Patent No.: US 6,807,647 B2
(45) Date of Patent: Oct. 19, 2004

(54) IC TEST SYSTEM AND STORAGE MEDIUM FOR THE SAME

(75) Inventor: Shintaro Mori, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 373 days.

(21) Appl. No.: 09/945,627

(22) Filed: Sep. 5, 2001

(65) Prior Publication Data

US 2002/0049945 A1 Apr. 25, 2002

(30) Foreign Application Priority Data

Sep. 28, 2000 (JP) .................................. 2000-296721

(51) Int. Cl.$^7$ .............................................. G01R 31/28
(52) U.S. Cl. ...................................... 714/741; 714/738
(58) Field of Search ................................ 714/741, 730, 714/738, 739, 740, 742

(56) References Cited

U.S. PATENT DOCUMENTS 6,098,187 A * 8/2000 Takahashi .................. 714/741

* cited by examiner

Primary Examiner—Guy J. Lamarre
Assistant Examiner—James C. Kerveros
(74) Attorney, Agent, or Firm—Oliff & Berridge PLC (57) ABSTRACT

An IC test system comprises: a test pattern signal applying section for applying a test pattern signal to an IC to be tested, in accordance with a test program; a simulation section for simulating an operation of the test pattern signal applying section in accordance with a simulation program; and a management device which is connected detachably with the test pattern signal applying section, for managing the operation of the test pattern signal applying section and an operation of the simulation section in accordance with a management program, for storing information about each operation of the test pattern signal applying section and the simulation section, and for managing one of the information about the operation of the simulation section and the information about the operation of the test pattern signal applying section in accordance with the other information.

8 Claims, 6 Drawing Sheets

IC TEST SYSTEM AND STORAGE MEDIUM FOR THE SAME

BACKGROUND OF THE INVENTION

1. Field of the Invention

The present invention relates to an IC test system for testing whether or not characteristics of an IC satisfy the predetermined standard, and relates to a storage medium for the same.

2. Description of Related Art

In general, an IC (Integrated Circuit), an LSI (Large Scale Integrated circuit) and the like (hereinbelow, these will be described only as "an IC") have some dispersion in characteristics by each product when they are mass-produced. Then, an IC test system has been utilized for testing whether or not characteristics of an IC satisfy the predetermined standard.

Figure 5:
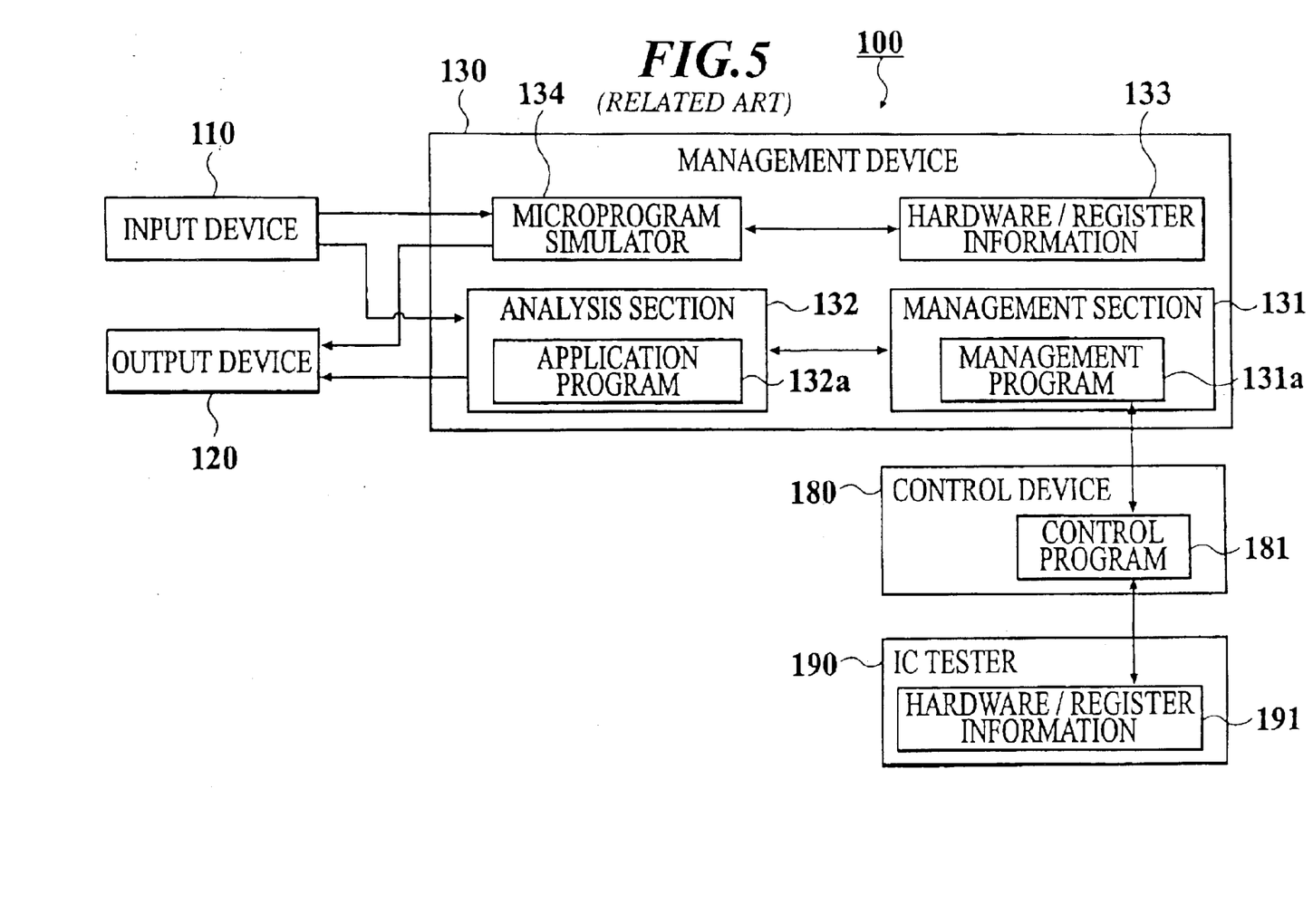
FIG. 5 is a functional block diagram showing a construction of an IC test system 100 according to an earlier development.

An example of construction of a former IC test system according to an earlier development is shown in FIG. 5. In this drawing, the IC test system 100 comprises an input device 110, an output device 120, a management device 130, a control device 180 and an IC tester 190.

The input device 110, such as a keyboard or a mouse, to which an operator inputs a microprogram for simulating an operation of the IC tester 190 which will be explained below, and a data for identifying a test pattern signal which is to be applied to an IC. The output device 120, such as a display or a printer, outputs the situation of simulation of the microprogram simulator 134, or conditions or a result of an actual operation of the IC tester 190. The IC tester 190 and the microprogram simulator 134 will be explained below.

The management device 130 outputs control signals to other elements of the IC test system 100, and manages the whole of the IC test system 100. The management device 130 comprises a management section 131, an analysis section 132, a storage area for storing hardware/register information 133 and a microprogram simulator 134.

The management section 131 comprises a management program 131a, and manages data communication between the analysis section 132 and the control device 180 which will be explained below, in accordance with a process described in the management program 131a.

The analysis section 132 comprises an application program 132a, and analyzes a test result obtained by operating the IC tester 190 which will be explained below, in accordance with the process described in the application program 132a.

The microprogram simulator 134 simulates the operation of the IC tester 190. The operation of the microprogram simulator 134 will be explained below. The hardware/register information 133 comprises information about simulation condition and a simulation result of the microprogram simulator 134.

The control device 180 is connected to the management section 131 and the IC tester 190. The control device 180 analyzes the control signal which is input by the management section 131, according to the control program 181, and controls the IC tester 190 in accordance with the analysis result.

The IC tester 190 actually tests characteristics of an IC under the control by the control device 180. The IC tester 190 comprises a test pattern signal generator (which is not shown in the figures) which applies a predetermined test pattern signal for testing the electric characteristics of the IC, to the IC as a product.

The IC tester 190 comprises a storage area for storing hardware/register information 191 separate from the hardware/register information 133. The hardware/register information 191 comprises information about a test condition and a test result of the IC tester 190.

Then, the operation of the IC test system 100 will be explained. At first, when an operator inputs a data through the input device 110, for identifying a test pattern signal to be applied to an IC, the analysis section 132 analyzes the data to output the analysis result to the management section 131. When the management section 131 receives the analysis result, the management section 131 outputs the analysis result to the control device 180.

The control device 180 executes the control program 181. Further, the control device 180 processes the analysis result obtained by operating the analysis section 132, and controls the IC tester 190 in accordance with the processed result. The IC tester 190 applies a test pattern signal to an IC in accordance with the control by the control device 180, and outputs a test result, that is, a response from the IC, to the control device 180.

The control device 180 outputs the test result obtained by operating the IC tester 190 to the management section 131. When the management section 131 receives the test result, the management section 131 outputs the test result to the analysis section 132. The analysis section 132 analyzes the test result and outputs an analysis result to the output device 120. As described above, an actual test of an IC is carried out.

On the other hand, the microprogram simulator 134 simulates the operation of the IC tester 190. The operation of the microprogram simulator 134 will be explained, in view of the flowchart shown in FIG. 6. At first, the microprogram simulator 134 executes a translation process for translating a microprogram which is input through the input device 110, into the executable program codes (step S600).

Figure 6:
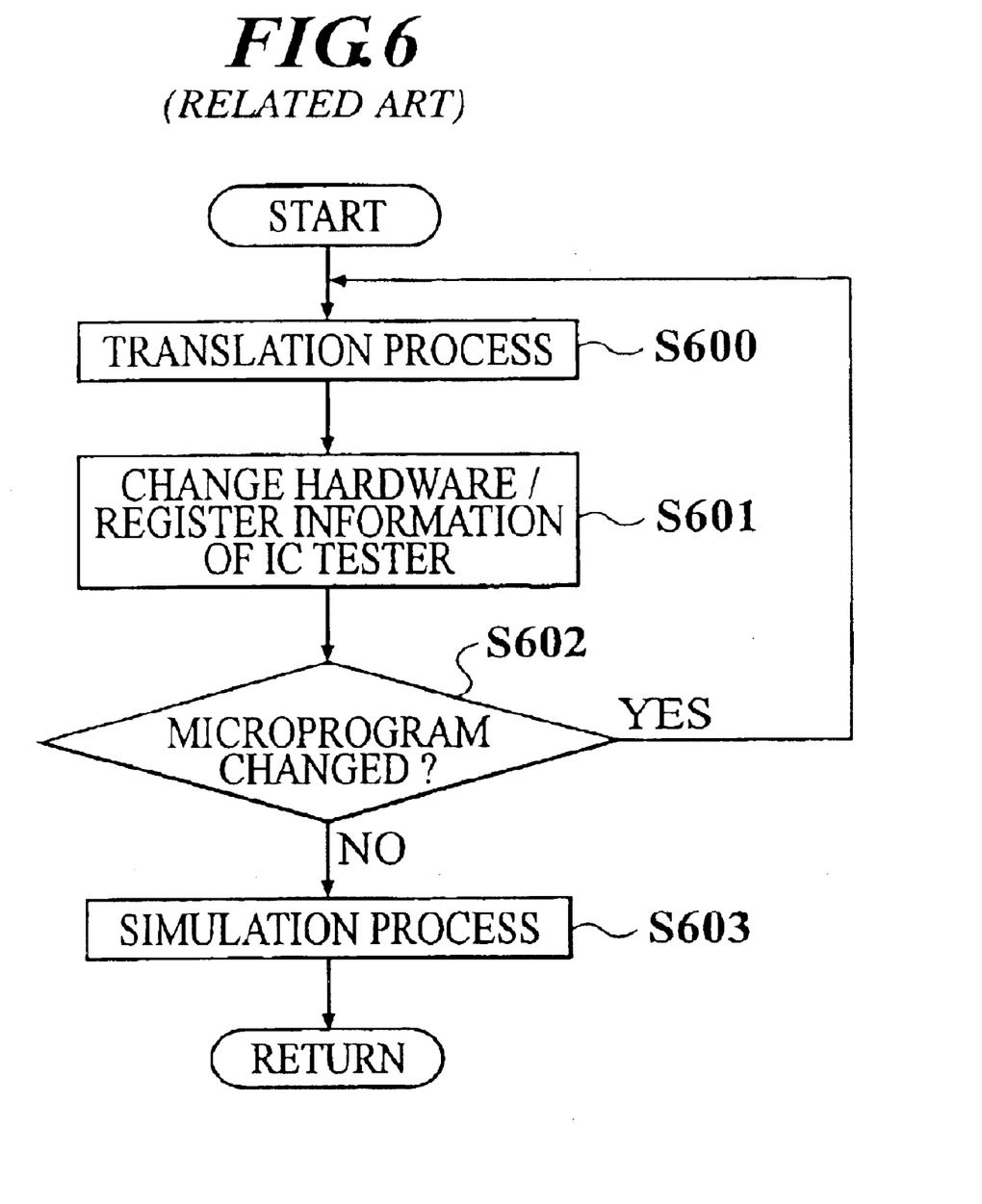
FIG. 6 is a flowchart showing the operation of the IC test system 100 shown in FIG. 5.

Then, the microprogram simulator 134 changes the contents of the hardware/register information 133 in accordance with the program codes formed by translating the microprogram (step S601). Here, when the contents of the hardware/register information 133 are changed by an operator through the input device 110 (step S602; YES), the process is back to the step S600, and the microprogram simulator 134 executes the translation process.

When the contents of the hardware/register information 133 are not changed (step S602; NO), the microprogram simulator 134 executes a simulation process (step S603). The microprogram simulator 134 simulates the operation of the IC tester 190, and outputs the simulation result to the output device 120.

As described above, the microprogram simulator 134 is not required to work with the analysis section 132 and the management section 131. Therefore, the microprogram simulator 134 can operate separately. Moreover, an operator can confirm the operation of the IC tester 190 without actually using of the IC tester 190, evaluate the microprogram which the operator programmed, and design a test pattern signal for being applied to an IC in accordance with the simulation result.

However, in this IC test system 100 according to an earlier development, because the management section 131 manages the hardware/register information 133 and the hardware/register information 191 separately, the simulation result of the microprogram simulator 134 cannot be analyzed by the analysis section 132 in real time. Further, the microprogram which is input for the simulation, cannot be reused as a microprogram for an actual test operated by the IC tester 190 immediately. Therefore, the working efficiency of an operator was deteriorated.

Moreover, the IC test system 100, as a whole, requires many storage areas, because the IC test system 100 sets the hardware/register information 133 which is exclusively used by the microprogram simulator 134, separate from the hardware/register information 191 of the IC tester 190.

SUMMARY OF THE INVENTION

An object of the invention is to provide an IC test system which improves the working efficiency of an operator. Concretely, an object of this invention is to provide an IC test system which enables the simulation result to be analyzed by an analysis section in real time, and enables a microprogram which is input for setting the simulation condition, to be reused for setting the actual test condition, by making the microprogram simulator and the analysis section share the information about the simulation and the information about the test.

In accordance with the first aspect of the invention, an IC test system comprises:

a test pattern signal applying section for applying a test pattern signal to an IC to be tested, in accordance with a test program;

a simulation section for simulating an operation of the test pattern signal applying section in accordance with a simulation program; and a management device which is connected detachably with the test pattern signal applying section, for managing the operation of the test pattern signal applying section and an operation of the simulation section in accordance with a management program, for storing information about each operation of the test pattern signal applying section and the simulation section, and for managing one of the information about the operation of the simulation section and the information about the operation of the test pattern signal applying section in accordance with the other information.

Here, the test pattern signal applying section applies a test pattern signal to an IC to be tested according to the test program. The simulation section simulates the operation of the test pattern signal applying section according to the simulation program. The management device stores the information about the operation of the test pattern signal applying section and the operation of the simulation section, and manages the operation of the test pattern signal applying section and the operation of the simulation section.

The management device manages the operation of the test pattern signal applying section and the operation of the simulation section. A test condition and a test result of the test pattern signal applying section, and a simulation condition and a simulation result of the simulation section are managed mutually by the management device. Therefore, the simulation result can be analyzed in real time by the analysis section, and a microprogram which is input for setting the simulation condition can be reused as a microprogram for setting a test condition. Further, the working efficiency of an operator can be improved.

Furthermore, as opposed to an IC test system according to an earlier development, the simulation condition and the simulation result of the simulation section, and the test condition and the test result of the test pattern signal applying section are not required to be set separately. Therefore, it is possible that the whole of the storage areas can be effectively used.

The information about the operation of the simulation section may be a simulation result, and the information about the operation of the test pattern signal applying section may be a test result.

The information about the operation of the simulation section may be a simulation condition, and the information about the operation of the test pattern signal applying section may be a test condition.

Preferably, the information about the operation of the simulation section is a simulation condition and a simulation result, the information about the operation of the test pattern signal applying section is a test condition and a test result, in case that the test pattern signal applying section is connected with the management device, the management device manages the test condition of the test pattern signal applying section in accordance with the simulation condition of the simulation section, and in case that the test pattern signal applying section is detached from the management device, the management device manages the simulation condition and the simulation result of the simulation section in accordance with the test condition and the test result of the test pattern signal applying section.

More preferably, the management device further comprises a storage area setting unit for setting a storage area as a common storage area for storing the information about the operation of the simulation section and the information about the operation of the test pattern signal applying section or as a separate storage area for separately storing the information about the operation of the simulation section and the information about the operation of the test pattern signal applying section, in accordance with whether the management device is connected with the test pattern signal applying section.

Here, the management device comprises the storage area setting unit. The storage area setting unit sets a storage area as a common storage area for storing the information about the operation of the simulation section and the information about the operation of the test pattern signal applying section or as a separate storage area for separately storing the information about the operation of the simulation section and the information about the operation of the test pattern signal applying section, in accordance with whether the management device is connected with the test pattern signal applying section.

Therefore, an operator can operate only the simulation section separately, because the information about the operation of the test pattern signal applying section, and the information about the operation of the simulation section, are managed separately, even though the test pattern signal applying section is not connected with the management device.

More preferably, the simulation section controls the storage area for information about an operation set by the management device, so as to switch the storage area between the common storage area and the separate storage area.

Here, the simulation section controls the storage area of the management device so as to switch the storage area between the common storage area and the separate storage area. Therefore, it is possible that an operator can connect the test pattern signal applying section with the management device if necessary, and can feed the information about the simulation condition of the simulation section back to the connected test pattern signal applying section, even though the management device has previously operated only the simulation section without the connection with the test pattern signal applying section. Further, the operability of the IC test system can be improved. As a result, the working efficiency of an operator can be improved.

More preferably, in case that the storage area for storing the information about the operation of the simulation section and the information about the operation of the test pattern signal applying section is the common storage area, when at least one of the information about the operation of the simulation section and the information about the operation of the test pattern signal applying section is changed, the management device transmits the changed information to the test pattern signal applying section and the simulation section in real time.

Here, in case that the storage area for storing the information about the operation of the simulation section and the information about the operation of the test pattern signal applying section is the common storage area, when at least one of the information about the operation of the simulation section and the information about the operation of the test pattern signal applying section is changed, the management device transmits the changed information to the test pattern signal applying section and the simulation section in real time. Therefore, it is possible that the simulation condition of the simulation section can be reflected on the actual operation of the test pattern signal applying section immediately.

Moreover, when an operator sets the simulation condition, the operator can consider the actual test condition and the actual test result of the test pattern signal applying section in real time. Therefore, it is possible that the working efficiency of the operator for the simulation process can be much improved.

Still more preferably, in case that the storage area for storing the information about the operation of the simulation section and the information about the operation of the test pattern signal applying section is not common, the management device manages the information about the operation of the simulation section without reference to the management program.

Here, in case that the storage area for storing the information about the operation of the simulation section and the information about the operation of the test pattern signal applying section is not common, the management device manages the information about the operation of the simulation section without reference to the management program.

That is, the management device refers to a program for managing only the information about the operation of the simulation section instead of the management program, like a management program according to an earlier development, when the storage area for storing the information about the operation of the test pattern signal applying section and the information about the operation of the simulation section is not common.

Therefore, the IC test system can be realized at a low cost by a minimum change of a construction of an existing IC test system according to an earlier development, because it is possible that the management device can comprise a management program like an earlier development.

In accordance with the second aspect of the invention, the storage medium has a program recorded thereon, which is executable by a computer for controlling an operation of an IC test system, wherein the program comprises:

a program code for applying a test pattern signal to an IC to be tested;

a program code for simulating an applying operation of applying the test pattern signal to the IC to be tested;

a program code for managing the applying operation and a simulating operation of simulating the applying operation, and for storing information about the applying operation and information about the simulating operation; and a program code for managing one of the information about the simulating operation and the information about the applying operation in accordance with the other information.

According to the second aspect of the invention, in order to control the operation of the IC test system, an operator can execute, in a computer, a program having the program codes for applying a test pattern signal to an IC to be tested, for simulating the applying operation, for managing the applying operation and the simulating operation, for storing information about the applying operation and information about the simulating operation, and for managing one of the information about the simulating operation and the information about the applying operation in accordance with the other information.

Moreover, the computer for executing the program stored in the storage medium operates like the IC test system of the first aspect of the present invention. Therefore, the IC test system in which the working efficiency of an operator can be improved and in which the whole storage areas can be effectively used, can be realized.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Figure 1:
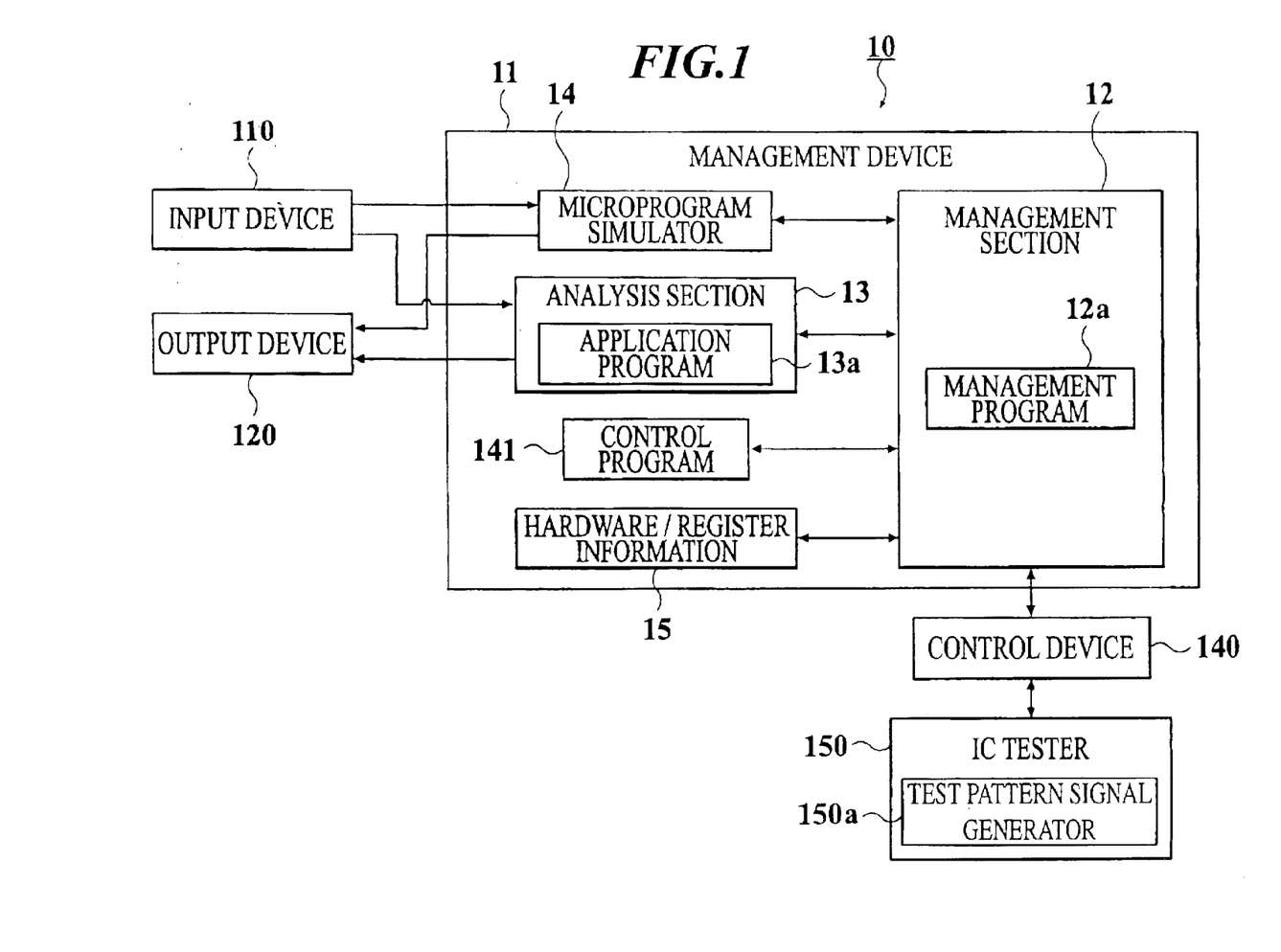
FIG. 1 is a functional block diagram showing the construction of the main elements of the IC test system 10 to which the present invention is applied.

Hereinbelow, an embodiment of the present invention will be explained in detail with reference to FIGS. 1 to 4. At first, the construction of the present embodiment will be explained. FIG. 1 is a functional block diagram showing the construction of the main elements of the IC test system 10 to which the present invention is applied. As shown in FIG. 1, the IC test system 10 comprises an input device 110, an output device 120, a management device 11, a control device 140 and an IC tester 150.

Here, each element which is marked with the same reference numeral as each element shown in FIG. 5, is almost similar to each element of the IC test system 100. Therefore, these elements will not be explained in detail.

As shown in FIG. 1, the management device 11 comprises a management section 12, an analysis section 13 and a microprogram simulator 14. Further, the management device 11 stores hardware/register information 15.

The management section 12 comprises a management program 12a, and manages each element of the management device 11 in accordance with a management procedure described in the management program 12a. In detail, the management section 12 always manages each operation of the IC tester 150 and the microprogram simulator 14 which will be explained below. Moreover, the management section 12 is detachably connected with the control device 140 and the IC tester 150.

The analysis section 13 comprises an application program 13a. The analysis section 13 analyzes a test result of the IC tester 150 and a simulation result of the microprogram simulator 14 which will be explained below, in accordance with an analysis procedure described in the application program 13a, and outputs the analysis result to the output device 120.

The microprogram simulator 14 simulates the operation of the IC tester 150, and outputs a management signal to the management section 12 in order to update a part of the hardware/register information 15 which will be explained below, according to the simulation of the microprogram simulator 14.

The hardware/register information 15 comprises information about a test condition and a test result of the IC tester 150, and information about the simulation condition and the simulation result of the microprogram simulator 14.

The control device 140 is connected to the management section 12 and the IC tester 150. The control device 140 analyzes the control signal which is input by the management section 12, and controls the IC tester 150 in accordance with the analysis result.

The IC tester 150 actually tests characteristics of an IC under the control by the control device 140. The IC tester 150 comprises a test pattern signal generator 150a which applies a predetermined test pattern signal for testing the electric characteristics of the IC, to the IC as a product.

One of the main features of the IC test system 10 is that a storage management system that the hardware/register information 15 can be shared by the analysis section 13 and the microprogram simulator 14, is adopted.

Figure 2:
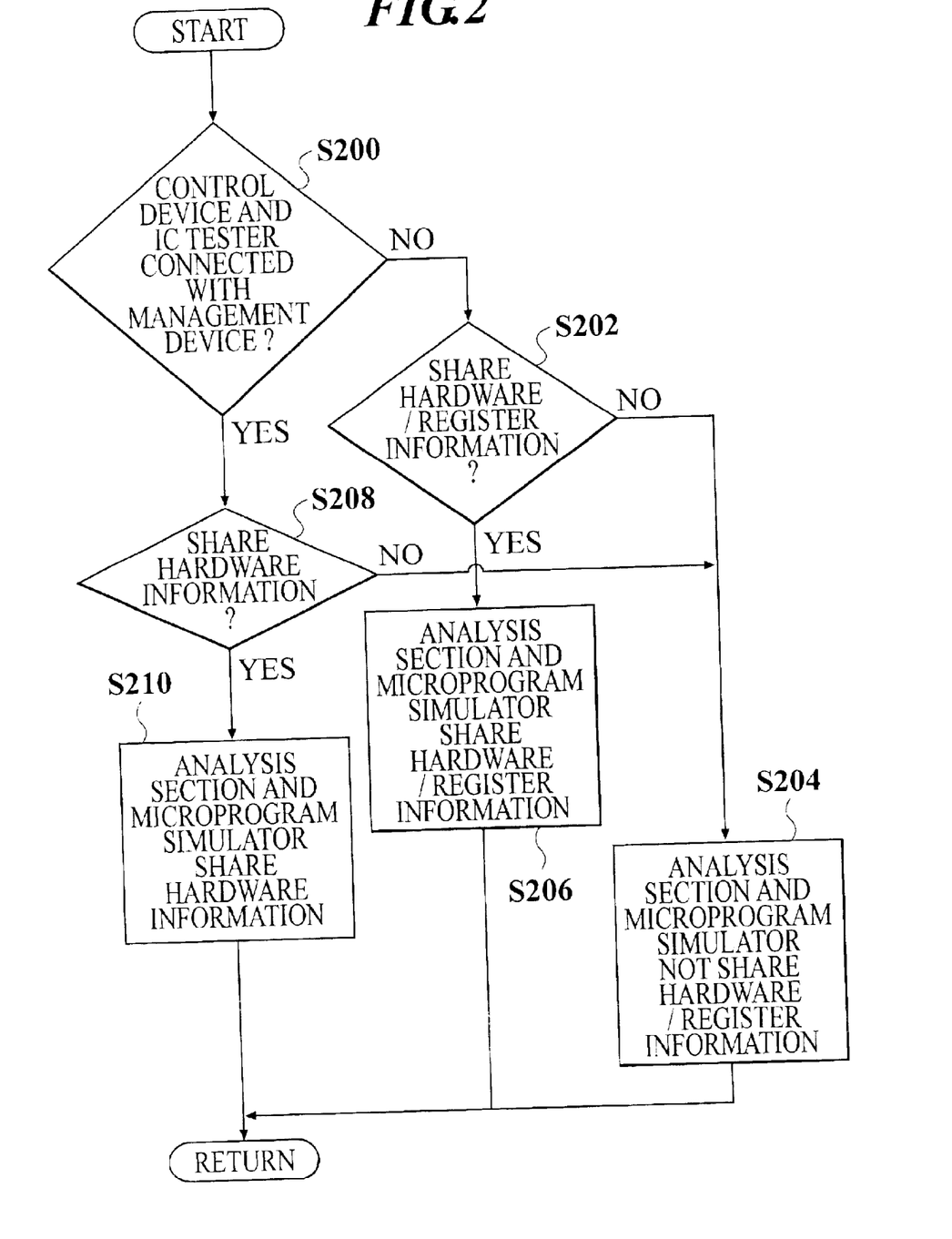
FIG. 2 is a flowchart showing the operation of the storage management system of the IC test system 10 shown in FIG. 1.

Hereinbelow, the storage management process of the IC test system 10 will be explained with reference to the flowchart shown in FIG. 2. At first, the management section 12 judges whether the control device 140 and the IC tester 150 are connected with the management device 11, when the microprogram simulator 14 is started (step S200).

When the control device 140 and the IC tester 150 are not connected with the management device 11 (step S200; NO), the management section 12 commands the output device 120 to show the menu items (which are not shown in the figures) to be selected, for deciding whether the hardware/register information 15 is shared by the analysis section 13 and the microprogram simulator 14. An operator can select the menu items through the input device 110 (step S202).

When an operator selects the menu item for deciding not to share the information about the test condition and the test result and the information about the simulation condition and the simulation result, of the hardware/register information 15 (step S202; NO), the analysis section 13 and the microprogram simulator 14 do not share the information about the test condition and the test result, and the information about the simulation condition and the simulation result, of the hardware/register information 15 (step S204).

In this case, the management section 12 manages the information about the test condition and the test result of the IC tester 150 and the information about the simulation condition and the simulation result of the microprogram simulator 14 separately, without reference to the management program 12a. Here, an operator can reselect the menu items like the step S202.

That is, it is possible that the microprogram simulator 14 can control the information about the simulation condition and the simulation result of the microprogram simulator 14 and the information about the test condition and the test result of the IC tester 150 in the hardware/register information 15, so as to switch these two kinds of information between information shared by the analysis section 13 and the microprogram simulator 14 and unshared information. This switching control is carried in accordance with the menu items (which are not shown in the figures), which are shown by the output device 120. An operator can decide whether the hardware/register information 15 is shared by the analysis section 13 and the microprogram simulator 14 again.

On the other hand, when an operator selects the menu item for deciding to share the hardware/register information 15 (step S202; YES), the analysis section 13 and the microprogram simulator 14 share the hardware/register information 15 in this IC test system 10 (step S206).

That is, the information about the simulation condition and the simulation result of the microprogram simulator 14, and the information about the test condition and the test result of the IC tester 150, in the hardware/register information 15 which is stored in the management device 11, are shared by the analysis section 13 and the microprogram simulator 14.

Moreover, one of the information about the simulation condition and the simulation result of the microprogram simulator 14 and the information about the test condition and the test result of the IC tester 150, is managed by the management section 12 in accordance with the other information. Here, in this case, an operator can also decide whether the hardware/register information 15 is shared by the analysis section 13 and the microprogram simulator 14.

On the other hand, when the control device 140 and the IC tester 150 are connected with the management device 11 (step S200; YES), the management section 12 commands the output device 120 to show menu items (which are not shown in the figures) to be selected for deciding whether the hardware information of the hardware/register information 15, that is, the information about the test condition and the simulation condition, is shared by the analysis section 13 and the microprogram simulator 14. Here, in case that the control device 140 and the IC tester 150 are not connected with the management device 11, register information of the hardware/register information 15, that is, information about the test result and the simulation result, is not shared by the analysis section 13 and the microprogram simulator 14, even though an operator selects any one of the menu items. An operator can select the menu items through the input device 110 (step S208).

When an operator selects the menu item for deciding not to share the hardware information (step S208; NO), the analysis section 13 and the microprogram simulator 14 do not share the information about the test condition and the test result of the IC tester 150 and the information about the simulation condition and the simulation result in the hardware/register information 15 (step S204) like the case where an operator decides that the hardware/register information 15 is not shared by the analysis section 13 and the microprogram simulator 14 in the step S202.

In this case, the management section 12 manages the information about the test condition and the test result of the IC tester 150 and the information about the simulation condition and the simulation result of the microprogram simulator 14 separately, without reference to the management program 12a. Here, an operator can reselect the menu items like the step S208.

That is, it is possible that the microprogram simulator 14 can control the hardware information of the hardware/register information 15 so as to switch the hardware information between information shared by the analysis section 13 and the microprogram simulator 14 and unshared information. This switching control is carried out in accordance with the menu items (which are not shown in the figures), which are shown by the output device 120. An operator can decide whether the hardware/register information 15 is shared by the analysis section 13 and the microprogram simulator 14 again.

On the other hand, when an operator selects the menu item for deciding to share the hardware information of the hardware/register information 15 (step S208; YES), the analysis section 13 and the microprogram simulator 14 share the hardware information of the hardware/register information 15, in this IC test system 10 (step S210).

In this case, the hardware information, that is, the information about the simulation condition of the microprogram simulator 14 and the information about the test condition of the IC tester 150 are shared by the analysis section 13 and the microprogram simulator 14.

Moreover, one of the information about the simulation condition of the microprogram simulator 14 and the information about the test condition of the IC tester 150, is managed by the management section 12 in accordance with the other information. Here, in this case, like the step S208, an operator can also reselect the menu items for deciding whether the hardware information of the hardware/register information 15 is shared by the analysis section 13 and the microprogram simulator 14.

Figure 4:
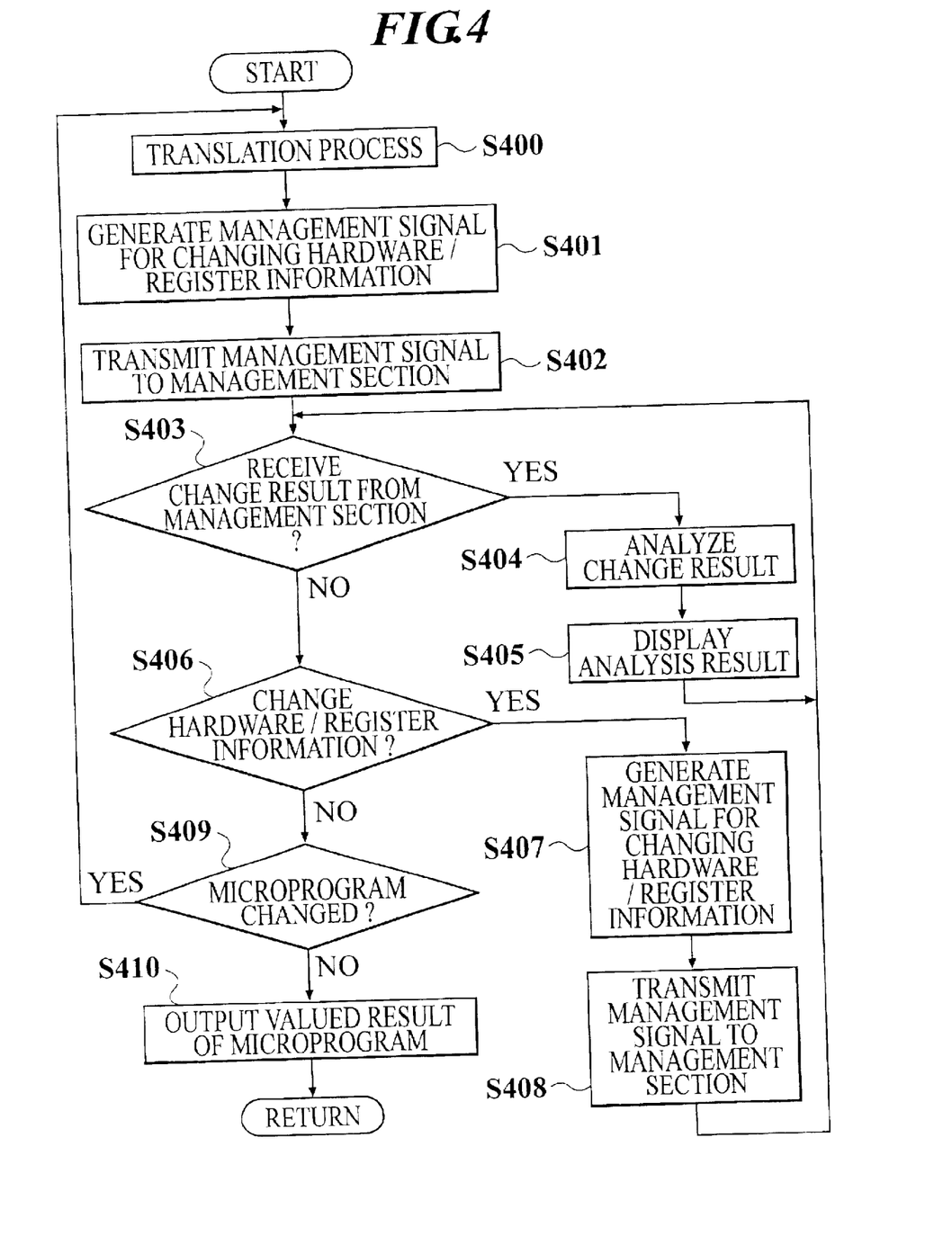
FIG. 4 is a flowchart showing the operation of the IC test system 10 shown in FIG. 1.

Secondly, the operation of the IC test system 10 in case where the analysis section 13 and the microprogram simulator 14 share the hardware/register information 15, will be explained with reference to the flowchart shown in FIG. 4.

At first, the microprogram simulator 14 executes a translation process (step S400). In the translation process, the microprogram simulator 14 translates a microprogram which is input through the input device 110, into the executable program codes which the microprogram simulator 14 can execute. The microprogram simulator 14 executes the simulation in accordance with the program codes formed by translating the microprogram.

During the simulation, the microprogram simulator 14 generates a management signal for changing a part of the hardware/register information 15 (the information about the simulation condition and/or the test condition) (step S401), and transmits the management signal to the management section 12 (step S402).

When the management section 12 receives the management signal, the management section 12 changes a part of the hardware/register information 15 in accordance with the management signal. Then, the management section 12 feeds the change result, back to the microprogram simulator 14, the IC tester 150 and the analysis section 13 in real time.

Here, the analysis section 13 always waits for a response from the management section 12 in real time (step S403).

When the analysis section 13 receives the change result of the hardware/register information 15 from the management section 12 (step S403; YES), the analysis section 13 analyzes the change result (step S404), and outputs the analysis result to the output device 120 (step S405).

On the other hand, when the analysis section 13 does not receive the change result from the management section 12 (step S403; NO), that is, in the case where the analysis section 13 still waits for a response from the management section 12, the microprogram simulator 14 continues the simulation.

Here, when a part of the hardware/register information 15 is to be changed in accordance with the simulation (step S406; YES), the microprogram simulator 14 sequentially generates a management signal for changing a part of the hardware/register information 15 (step S407). Further, the microprogram simulator 14 transmits the management signal to the management section 12 sequentially (step S408).

On the other hand, when a part of the hardware/register information 15 is not to be changed (step S406; NO), the microprogram simulator 14 judges whether the microprogram is changed by an operator through the input device 110 (step S409).

When the microprogram simulator 14 detects a change of the microprogram (step S409; YES), the process is back to the step S400. The microprogram simulator 14 translates the changed microprogram. On the other hand, when the microprogram simulator 14 does not detect a change of the microprogram (step S409; NO), the microprogram simulator 14 outputs the valued result of the microprogram to the output device 120 (step S410), and finishes the simulation.

As described above, in accordance with the IC test system 10 of the present embodiment, the management device 11 manages the operation and the operation result of the IC tester 150 and the operation and the operation result of the microprogram simulator 14. The management device 11 manages the simulation condition and the simulation result of the microprogram simulator 14 in accordance with the test condition and the test result of the IC tester 150, and manages the test condition of the IC tester 150 in accordance with the simulation condition of the microprogram simulator 14. Therefore, as opposed to an IC test system according to an earlier development, in the IC test system 10, the simulation condition and the simulation result of the microprogram simulator 14, and the test condition and the test result of the IC tester 150 are not required to be set separately. Therefore, it is possible that the whole of the storage area of the IC test system 10 can be effectively used.

Moreover, in the IC test system 10 of the present embodiment, the information about the simulation condition and the simulation result of the microprogram simulator 14, and the information about the test condition and the test result of the IC tester 150, can be fed back to the analysis section 13, the microprogram simulator 14 and the IC tester 150 in real time. Therefore, it is possible that the number of times of the operations which are operated by an operator can be decreased. As a result, the working efficiency of the operator can be improved.

Figure 3:
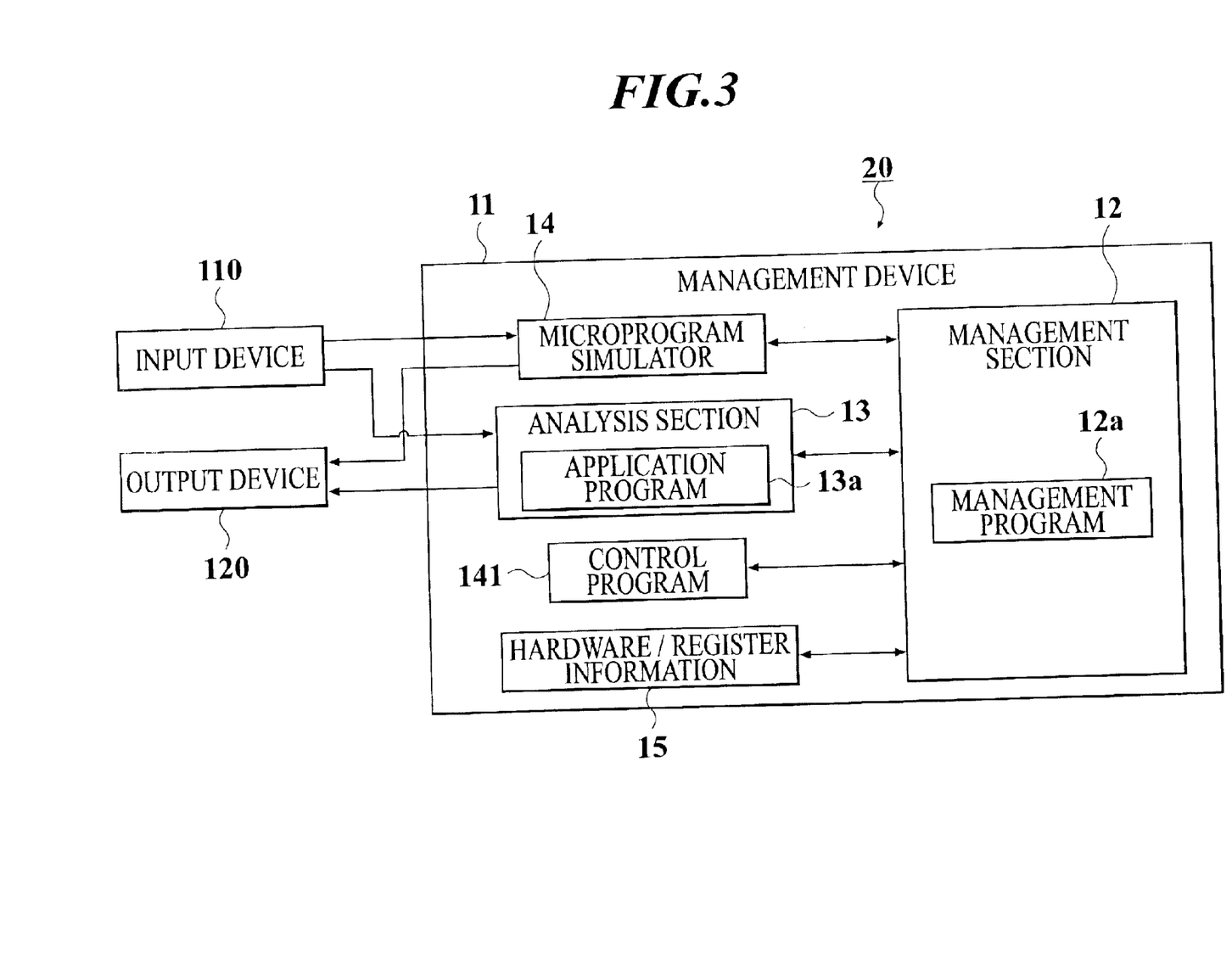
FIG. 3 is a functional block diagram showing the IC test system 10 shown in FIG. 1 in a situation that the control device 140 and the IC tester 150 are detached from the management device 11.

Moreover, in case that the control device 140 and the IC tester 150 are not connected with the management section 12, when an operator decides that the hardware/register information 15 is not shared by the analysis section 13 and the microprogram simulator 14, the management section 12 sets the information about the test condition and the test result of the IC tester 150 and the information about the simulation condition and the simulation result of the microprogram simulator 14, so as not to be shared by the analysis section 13 and the microprogram simulator 14. Therefore, even though that the IC tester 150 is detached from the management section 12, an operator can operate only the microprogram simulator 14 independently, because the test condition and the test result of the IC tester 150 and the simulation condition and the simulation result of the microprogram simulator 14 are managed separately.

Moreover, the microprogram simulator 14 has a switching function to control the information about the simulation condition and the simulation result of the microprogram simulator 14 and the information about the test condition and the test result of the IC tester 150 in the hardware/register information 15 so as to switch these two kinds of the information between information shared by the analysis section 13 and the microprogram simulator 14, and unshared information. Therefore, it is possible that an operator can connect the IC tester 150 with the management device 11 if necessary, and can feed the information about the simulation condition and the simulation result of the microprogram simulator 14 back to the connected IC tester 150, for example, even though the management device 11 has previously operated only the simulation without the connection with the IC tester 150. Therefore, it is possible that the operability of the IC test system 10 can be improved. As a result, the working efficiency of an operator can be improved.

Moreover, when the hardware/register information 15 is changed, the changed hardware/register information 15 is fed back to the analysis section 13, the microprogram simulator 14 and the IC tester 150 by the management section 12 in real time. Therefore, the simulation condition of the microprogram simulator 14 can be reflected on the actual test condition of the IC tester 150 immediately. During the simulation, the operator can consider the information about the actual test condition and the actual test result of the IC tester 150 immediately. Therefore, it is possible that the number of times of the operations which are carried out by an operator can be decreased, and the working efficiency of the operator can be much improved.

Furthermore, the management section 12 manages the simulation condition and the simulation result of the microprogram simulator 14 without reference to the management program 12a, when the information about the test condition and the test result of the IC tester 150 and the information about the simulation condition and the simulation result of the microprogram simulator 14 are not shared by the analysis section 13 and the microprogram simulator 14. Therefore, in this case, the IC test system 10 can be realized at a low cost by a minimum change of a construction of an existing IC test system according to an earlier development so as to refer to a program for managing only the simulation condition and the simulation result, like a management program according to an earlier development instead of the management program 12a.

The above description of the present embodiment relates to the one of the preferred examples of the IC test system according to the present invention. Therefore, the present invention is not limited to this.

For example, it is preferable that the GUI (Graphical User Interface) is provided in the IC test system. When the GUI is provided in the IC test system, it is possible that an operator can easily select a menu item by using a pointing device, such as a mouse or the like. Therefore, the working efficiency of an operator can be improved.

In addition, any other detailed constructions, and operations of the IC test system 10 may be changed without departing from the gist of the present invention.

According to the present invention, the working efficiency of an operator can be improved. The whole of the storage area of the IC test system can be effectively used.

Moreover, even though the test pattern signal applying section is detached from the management device, the test condition and the test result of the test pattern signal applying section, and the simulation condition and the simulation result of the simulation section, are managed separately. Therefore, an IC test system in which an operator can operate only the simulation section can be provided.

Moreover, an operator can connect the test pattern signal applying section with the management device if necessary, and can feed the information about the simulation condition and the simulation result of the simulation section back to the connected test pattern signal applying section, even though the management device has previously operated only the simulation section without the connection with the test pattern signal applying section. Therefore, the operability of the IC test system can be improved. The working efficiency of an operator can be improved.

Moreover, the simulation condition and the simulation result of the simulation section can be reflected on the actual operation of the test pattern signal applying section immediately. Further, when the simulation section operates the simulation, an operator can immediately judge whether the result of the actual operation of the test pattern signal applying section is corrected. Therefore, the number of times of the operations which are operated by an operator can be decreased. As a result, the working efficiency of the operator can be improved.

The IC test system according to the present invention can be realized at a low cost by a minimum change of a construction of an existing IC test system according to an earlier development, because it is possible that the management device can use a management program like an earlier development.

The entire disclosure of Japanese Patent Application No. Tokugan 2000-296721 filed on Sep. 28, 2000 including specification, claims, drawings and summary are incorporated herein by reference in its entirety.

What is claimed is:

1. An IC test system comprising:
a test pattern signal applying section for applying a test pattern signal to an IC to be tested, in accordance with a test program;
a simulation section for simulating an operation of the test pattern signal applying section in accordance with a simulation program; and
a management device which is connected detachably with the test pattern signal applying section, for managing the operation of the test pattern signal applying section and an operation of the simulation section in accordance with a management program, for storing information about each operation of the test pattern signal applying section and the simulation section, for managing the information about the operation of the test pattern signal applying section in accordance with the information about the operation of the simulation section, and for managing the information about the operation of the simulation section in accordance with the information about the operation of the test pattern signal applying section, wherein when at least one of the information about the operation of the simulation section and the information about the operation of the test pattern signal applying section is changed, the management device transmits the changed information to the test pattern signal applying section and the simulation section in real time.

2. The IC test system as claimed in claim 1, wherein the information about the operation of the simulation section is a simulation result, and the information about the operation of the test pattern signal applying section is a test result.

3. The IC test system as claimed in claim 1, wherein the information about the operation of the simulation section is simulation condition, and the information about the operation of the test pattern signal applying section is test condition.

4. The IC test system as claimed in claim 1, wherein the information about the operation of the simulation section is a simulation condition and a simulation result, the information about the operation of the test pattern signal applying section is a test condition and a test result, in case that the test pattern signal applying section is connected with the management device, the management device manages the test condition of the test pattern signal applying section in accordance with the simulation condition of the simulation section, and in case that the test pattern signal applying section is detached from the management device, the management device manages the simulation condition and the simulation result of the simulation section in accordance with the test condition and the test result of the test pattern signal applying section.

5. The IC test system as claimed in claim 1, wherein the management device further comprises a storage area setting unit for setting a storage area as a common storage area for storing the information about the operation of the simulation section and the information about the operation of the test pattern signal applying section or as a separate storage area for separately storing the information about the operation of the simulation section and the information about the operation of the test pattern signal applying section, in accordance with whether the management device is connected with the test pattern signal applying section.

6. The IC test system as claimed in claim 5, wherein the simulation section controls the storage area for information about an operation set by the management device, so as to switch the storage area between the common storage area and the separate storage area.

7. The IC test system as claimed in claim 5, wherein, in case that the storage area for storing the information about the operation of the simulation section and the information about the operation of the test pattern signal applying section is not common, the management device manages the information about the operation of the simulation section without reference to the management program.

8. A storage medium having a program recorded thereon, which is executable by a computer for controlling an operation of an IC test system, wherein the program comprises:

a program code for applying a test pattern signal to an IC to be tested;

a program code for simulating an applying operation of applying the test pattern signal to the IC to be tested;

a program code for managing the applying operation and a simulating operation of simulating the applying operation, and for storing information about the applying operation and information about the simulating operation; and a program code for managing the information about the applying operation in accordance with the information about the simulating operation, and for managing the information about the simulating operation in accordance with the information about the applying operation, wherein when at least one of the information about the simulating operation and the information about the applying operation is changed, the program code for managing the information about the applying operation and for managing the information about the simulating operation transmits the changed information to the program code for applying the test pattern signal and the program code for simulating the applying operation in real time.

* * * * *